United States Patent
Yang et al.

(10) Patent No.: US 9,349,884 B2
(45) Date of Patent: May 24, 2016

(54) SOLAR CELL

(71) Applicant: LG ELECTRONICS INC., Seoul (KR)

(72) Inventors: Juhong Yang, Seoul (KR); Dohwan Yang, Seoul (KR); Ilhyoung Jung, Seoul (KR); Jinah Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 234 days.

(21) Appl. No.: 13/779,025

(22) Filed: Feb. 27, 2013

(65) Prior Publication Data

US 2014/0041720 A1    Feb. 13, 2014

(30) Foreign Application Priority Data

Aug. 13, 2012    (KR) .................. 10-2012-0088462

(51) Int. Cl.
*H01L 31/0224* (2006.01)
*H01L 31/056* (2014.01)
*H01L 31/0216* (2014.01)
*H01L 31/068* (2012.01)

(52) U.S. Cl.
CPC .. *H01L 31/022458* (2013.01); *H01L 31/02167* (2013.01); *H01L 31/022425* (2013.01); *H01L 31/056* (2014.12); *H01L 31/068* (2013.01); *Y02E 10/52* (2013.01); *Y02E 10/547* (2013.01)

(58) Field of Classification Search
None
See application file for complete search history.

(56) References Cited

U.S. PATENT DOCUMENTS

| 2004/0097062 | A1* | 5/2004 | Preu et al. ................... 438/597 |
| 2009/0025786 | A1* | 1/2009 | Rohatgi et al. ............... 136/256 |
| 2009/0260685 | A1 | 10/2009 | Lee et al. |
| 2009/0301559 | A1 | 12/2009 | Rohatgi et al. |
| 2010/0024880 | A1 | 2/2010 | Lee |
| 2010/0193002 | A1 | 8/2010 | Dimroth et al. |
| 2011/0073176 | A1* | 3/2011 | Kim ............................ 136/256 |
| 2011/0265866 | A1 | 11/2011 | Oh et al. |
| 2012/0055547 | A1* | 3/2012 | Schultz-Wittmann et al. ..................... 136/256 |
| 2012/0111402 | A1* | 5/2012 | Hofmann et al. ............. 136/256 |

FOREIGN PATENT DOCUMENTS

| EP | 1 993 143 A1 | 11/2008 | |
| JP | 4-192569 A | 7/1992 | |
| JP | 8-111537 A | 4/1996 | |
| JP | 2010-539727 A | 12/2010 | |
| JP | 2011-233875 A | 11/2011 | |
| NO | GB 2471732 A * | 1/2011 | ...... H01L 31/022425 |
| WO | WO 2009/128678 A2 | 10/2009 | |
| WO | WO 2010/126572 A2 | 11/2010 | |

* cited by examiner

*Primary Examiner* — Jeffrey T Barton
*Assistant Examiner* — Eric R Smith
(74) *Attorney, Agent, or Firm* — Birch, Stewart, Kolasch & Birch, LLP

(57) ABSTRACT

A solar cell includes a substrate, an emitter region positioned at a first surface of the substrate, a first electrode positioned on the first surface of the substrate, a back passivation layer positioned on a second surface opposite the first surface of the substrate, and a second electrode which is positioned on the back passivation layer and is electrically connected to the substrate through holes of the back passivation layer. The second electrode includes connection electrodes positioned inside the holes of the back passivation layer and a back electrode layer positioned on the connection electrodes and the back passivation layer. An adhesion enhanced layer is positioned between the back electrode layer and the back passivation layer and contains at least one of intrinsic amorphous silicon and intrinsic microcrystalline silicon.

13 Claims, 7 Drawing Sheets

SOLAR CELL

This application claims priority to and the benefit of Korean Patent Application No. 10-2012-0088462 filed in the Korean Intellectual Property Office on Aug. 13, 2012, the entire contents of which are incorporated herein by reference.

BACKGROUND OF THE INVENTION

1. Field of the Invention

Embodiments of the invention relate to a solar cell.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted as cells for generating electric energy from solar energy, because the solar cells are able to draw energy from an abundant source and do not cause environmental pollution.

A solar cell generally includes a substrate and an emitter region, which are formed of a semiconductor of different conductive types, for example, a p-type and an n-type, and electrodes respectively connected to the substrate and the emitter region. A p-n junction is formed at an interface between the substrate and the emitter region.

When light is incident on the solar cell, a plurality of electron-hole pairs are generated in the semiconductors. The electron-hole pairs are separated into electrons and holes. Then, the separated electrons move to the n-type semiconductor (e.g., the emitter region), and the separated holes move to the p-type semiconductor (e.g., the substrate). The electrons and holes are collected by the electrodes electrically connected to the emitter region and the substrate, respectively. The electrodes are connected to each other using electric wires to thereby obtain electric power.

SUMMARY OF THE INVENTION

In one aspect, there is a solar cell including a substrate containing impurities of a first conductive type, an emitter region positioned at a first surface of the substrate, the emitter region containing impurities of a second conductive type opposite the first conductive type, a first electrode which is positioned on the first surface of the substrate and is electrically connected to the emitter region, a back passivation layer positioned on a second surface opposite the first surface of the substrate, the back passivation layer having a plurality of holes, a second electrode which is positioned on the back passivation layer and is electrically connected to the substrate through the plurality of holes of the back passivation layer, the second electrode including a plurality of connection electrodes and a back layer, the plurality of connection electrodes being positioned inside the plurality of holes of the back passivation layer and the back electrode layer being positioned on the plurality of connection electrodes and the back passivation layer, and an adhesion enhanced layer positioned between the back electrode layer of the second electrode and the back passivation layer, the adhesion enhanced layer containing at least one of intrinsic amorphous silicon and intrinsic microcrystalline silicon.

The adhesion enhanced layer may include a metal-silicon alloy layer at an interface between the adhesion enhanced layer and the back electrode layer. The metal-silicon alloy layer formed at the interface between the adhesion enhanced layer and the back electrode layer may be an aluminum-silicon alloy layer.

A thickness of the adhesion enhanced layer may be about 10 nm to 100 nm. A refractive index of the adhesion enhanced layer may be greater than a refractive index of the back passivation layer. For example, the refractive index of the adhesion enhanced layer may be about 3.7 to 4.2.

The solar cell may further include a diffusion barrier layer positioned between the back passivation layer and the adhesion enhanced layer. The diffusion barrier layer may contain silicon nitride (SiNX). A refractive index of the diffusion barrier layer may be about 2.1 to 2.3. A thickness of the diffusion barrier layer may be about 30 nm to 70 nm.

The back passivation layer may contain at least one of aluminum oxide (AlOx), silicon oxide (SiOx), silicon nitride (SiNx), and silicon oxynitride (SiOxNy). The back passivation layer may include a plurality of layers.

For example, the back passivation layer may include a first passivation layer abutting on the substrate and a second passivation layer positioned on the first passivation layer. The first passivation layer may contain aluminum oxide (AlOx), and the second passivation layer may contain silicon oxide (SiOx). A thickness of the first passivation layer may be about 5 nm to 15 nm, and a thickness of the second passivation layer may be about 150 nm to 250 nm.

The back electrode layer may contain a glass frit equal to or less than about 1 wt % per unit volume of the second electrode.

The connection electrodes and the back electrode layer may be formed of the same material and may contain aluminum (Al).

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that a detailed description of known arts will be omitted if it is determined that the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

Example embodiments of the invention will be described with reference to FIGS. 1 to 7.

Figure 1:
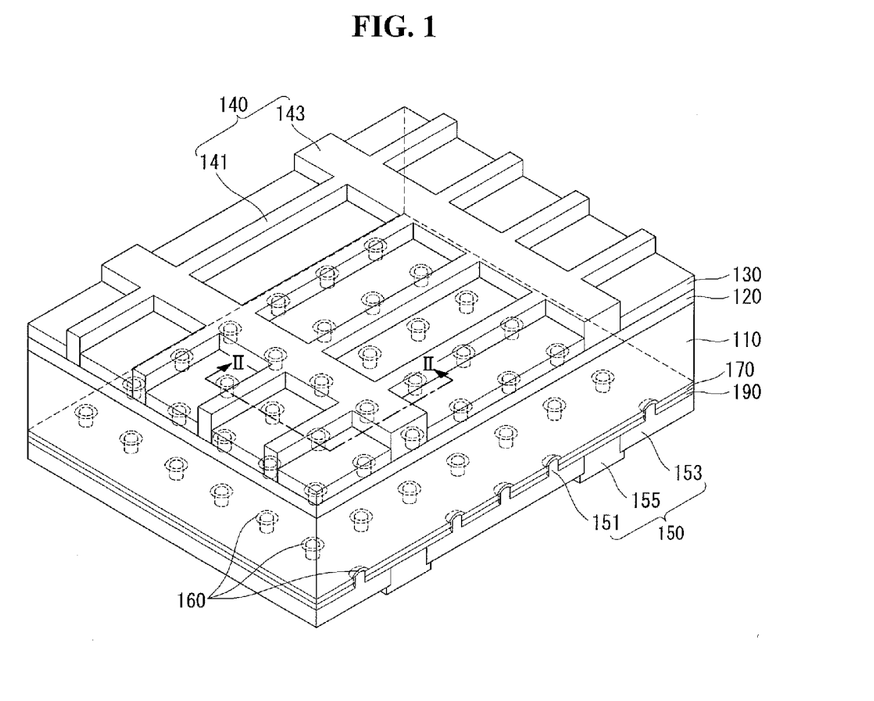
FIG. 1 is a partial perspective view of a solar cell according to an example embodiment of the invention.
Figure 2:
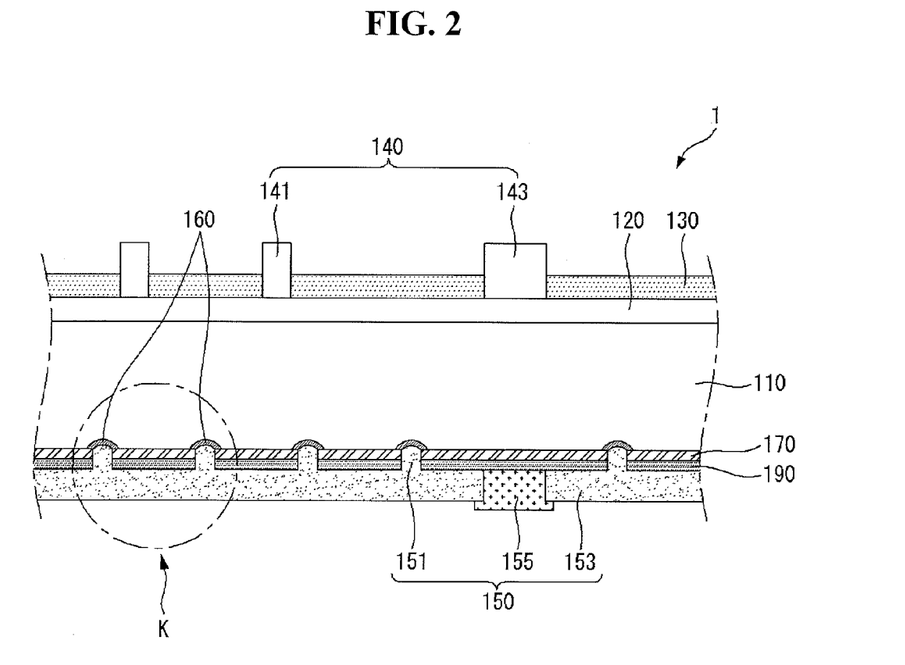
FIG. 2 is a cross-sectional view taken along line II-II of FIG. 1.

FIG. 1 is a partial perspective view of a solar cell according to an example embodiment of the invention. FIG. 2 is a cross-sectional view taken along line II-II of FIG. 1.

As shown in FIG. 1, a solar cell according to an example embodiment of the invention includes a substrate 110, an emitter region 120, an anti-reflection layer 130, a plurality of back surface field regions 160, a back passivation layer 170, a first electrode 140, and a second electrode 150.

FIG. 1 shows that the solar cell according to the embodiment of the invention includes the anti-reflection layer 130. Alternatively, the anti-reflection layer 130 may be omitted in the embodiment of the invention. However, it is preferable, but not required, that the anti-reflection layer 130 is formed in consideration of improving the efficiency of the solar cell.

The substrate 110 is a semiconductor substrate formed of silicon containing impurities of a first conductive type, for example, a p-type, though not required. Silicon used in the substrate 110 may be single crystal silicon, polycrystalline silicon, or amorphous silicon. When the substrate 110 is of the p-type, the substrate 110 contains impurities of a group III element such as boron (B), gallium (Ga), and indium (In). Alternatively, the substrate 110 may be of an n-type and/or may be formed of a semiconductor material other than silicon. If the substrate 110 is of the n-type, the substrate 110 may contain impurities of a group V element such as phosphorus (P), arsenic (As), and antimony (Sb).

FIGS. 1 and 2 show that uneven portions are not formed on the surface of the substrate 110. Alternatively, the substrate 110 may be textured to have a textured surface corresponding to an uneven surface or having uneven characteristics.

The emitter region 120 is positioned at a first surface of the substrate 110, on which light is incident. The emitter region 120 contains impurities of a second conductive type (for example, n-type) opposite the first conductive type (for example, p-type) of the substrate 110 to thereby form a p-n junction along with the substrate 110.

Carriers, i.e., electron-hole pairs produced by light incident on the substrate 110 are separated into electrons and holes by the p-n junction between the substrate 110 and the emitter region 120. Then, the separated electrons move to the n-type semiconductor, and the separated holes move to the p-type semiconductor. Thus, when the substrate 110 is of the p-type and the emitter region 120 is of the n-type, the electrons move to the emitter region 120, and the holes move to the substrate 110. Majority carriers in the substrate 110 are holes, and majority carriers in the emitter region 120 are electrons.

Because the emitter region 120 forms the p-n junction along with the substrate 110, the emitter region 120 may be of the p-type when the substrate 110 is of the n-type unlike the embodiment described above. In this instance, the electrons may move to the substrate 110, and the holes may move to the emitter region 120.

Returning to the embodiment of the invention, when the emitter region 120 is of the n-type, the emitter region 120 may be formed by doping the substrate 110 with impurities of a group V element such as phosphorus (P), arsenic (As), and antimony (Sb). On the contrary, when the emitter region 120 is of the p-type, the emitter region 120 may be formed by doping the substrate 110 with impurities of a group III element such as boron (B), gallium (Ga), and indium (In).

The anti-reflection layer 130 is positioned on the emitter region 120 and may be formed of silicon nitride ($SiN_x$) or silicon oxide ($SiO_x$), etc. The anti-reflection layer 130 reduces a reflectance of light incident on the solar cell and increases selectivity of a predetermined wavelength band, thereby increasing the efficiency of the solar cell. The anti-reflection layer 130 may have a thickness of about 80 nm to 100 nm, for example. The anti-reflection layer 130 may be omitted, if desired or necessary.

The first electrode 140 is positioned on the emitter region 120 and is electrically connected to the emitter region 120. As shown in FIG. 1, the first electrode 140 includes a plurality of finger electrodes 141 and a plurality of front bus bars 143.

The plurality of finger electrodes 141 are positioned on the emitter region 120 and are electrically connected to the emitter region 120. The finger electrodes 141 are separated from one another and extend in a fixed direction. The finger electrodes 141 collect carriers (for example, electrons) moving to the emitter region 120.

The plurality of front bus bars 143 are positioned on the emitter region 120 and are formed on the same level layer as the finger electrodes 141. The front bus bars 143 are electrically connected to the finger electrodes 141 and extend in a direction crossing the finger electrodes 141. The front bus bars 143 collect carriers, which are collected by the finger electrodes 141 and move, and then output the collected carriers to an external device.

The finger electrodes 141 and the front bus bars 143 may be formed of at least one conductive material. Examples of the conductive material include at least one conductive material selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

As shown in FIGS. 1 and 2, the back passivation layer 170 is positioned on a second surface opposite the first surface of the substrate 110 and may have a plurality of holes.

A cross-sectional shape of each of the plurality of holes formed in the back passivation layer 170 may be a circle or a polygon.

The back passivation layer 170 performs a passivation function for reducing a recombination of carriers at and around the second surface of the substrate 110. Further, the back passivation layer 170 increases an inner reflectance of light passing through the substrate 110, thereby increasing the reincidence of light passing through the substrate 110.

The second electrode 150 is positioned inside and on the holes of the back passivation layer 170 and is electrically connected to the substrate 110 through the holes of the back passivation layer 170. The second electrode 150 contains a metal material.

As shown in FIGS. 1 and 2, the second electrode 150 includes a plurality of connection electrodes 151 and a back electrode layer 153 and also may further include a plurality of back bus bars 155.

The connection electrodes 151 are positioned inside the holes of the back passivation layer 170 and are electrically connected to the substrate 110. The back electrode layer 153 is positioned on the back passivation layer 170 and connects the connection electrodes 151 positioned inside the holes of the back passivation layer 170 to one another.

The connection electrodes 151 and the back electrode layer 153 may be formed of a conductive material such as aluminum (Al). Alternatively, the connection electrodes 151 and the back electrode layer 153 may be formed of at least one conductive material selected from the group consisting of nickel (Ni), copper (Cu), silver (Ag), tin (Sn), zinc (Zn), indium (In), titanium (Ti), gold (Au), and a combination thereof. Other conductive materials may be used.

The connection electrodes 151 and the back electrode layer 153 may be formed of the same material. For example, both the connection electrodes 151 and the back electrode layer 153 may be formed of aluminum (Al).

The connection electrodes 151 collect carriers (for example, holes) moving from the substrate 110 and transfer the collected carriers to the back electrode layer 153. The connection electrodes 151 may be formed by forming holes in the back passivation layer 170 and an adhesion enhanced layer 190 using a laser or an etching paste, applying a paste containing the conductive material such as aluminum (Al) to the holes, and performing a thermal process on the paste.

The back bus bars 155 are positioned on the back passivation layer 170 and are electrically connected to the connection electrodes 151 or the back electrode layer 153. The back bus bars 155 may have a stripe shape extending in the same direction as the front bus bars 143. In this instance, the back bus bars 155 may be positioned opposite the front bus bars 143.

FIGS. 1 and 2 show that the back bus bars 155 are formed on the back passivation layer 170 while overlapping the connection electrodes 151. Alternatively, the back bus bars 155 may be formed on the back passivation layer 170 while not overlapping the connection electrodes 151.

In another embodiment of the invention, the back bus bars 155 may include a plurality of conductors of a circle shape or a polygon shape which are positioned at a constant distance therebetween.

The back bus bars 155 collect carriers (for example, holes) which are transferred from the substrate 110 to the back electrode layer 153 through the connection electrodes 151, and output the carriers to the external device.

The back bus bars 155 may be formed of a conductive material such as silver (Ag). Alternatively, the back bus bars 155 may be formed of at least one conductive material selected from the group consisting of nickel (Ni), copper (Cu), aluminum (Al), tin (Sn), zinc (Zn), indium (In), titanium (Ti), gold (Au), and a combination thereof. Other conductive materials may be used.

The back bus bars 155 may be formed so that they partially overlap an upper part of the back electrode layer 153 and are electrically connected to the back electrode layer 153. Thus, a contact resistance between the back bus bars 155 and the back electrode layer 153 decreases, and a contact efficiency therebetween is improved. Hence, the transfer efficiency of carriers from the back electrode layer 153 to the back bus bars 155 is improved.

The back surface field regions 160 are positioned between the connection electrodes 151, which are positioned inside the holes of the back passivation layer 170, and the substrate 110. Each of the back surface field regions 160 is a region (for example, a p+-type region) which is more heavily doped than the substrate 110 with impurities of the same conductive type as the substrate 110.

The back surface field regions 160 are formed by diffusing the metal material (i.e., impurities of the first conductive type) contained in the second electrode 150 into the substrate 110 when the second electrode 150 is dried and fired through the thermal process.

A potential barrier is formed by a difference between impurity doping concentrations of the substrate 110 and the back surface field regions 160 to thereby generate a potential difference between the substrate 110 and the back surface field regions 160. Hence, the potential barrier prevents or reduces electrons from moving to the second surface of the substrate 110, thereby preventing a recombination and/or a disappearance of electrons and holes at and around the second surface of the substrate 110.

An operation of the solar cell having the above-described structure is described below.

When light irradiated to the solar cell is incident on the substrate 110 through the anti-reflection layer 130 and the emitter region 120, a plurality of electron-hole pairs are generated in the substrate 110 by light energy produced based on the incident light. In this instance, because a reflection loss of the light incident on the substrate 110 is reduced by the anti-reflection layer 130, an amount of light incident on the substrate 110 increases.

The electron-hole pairs are separated into electrons and holes due to the p-n junction of the substrate 110 and the emitter region 120. The electrons move to the n-type emitter region 120, and the holes move to the p-type substrate 110. The electrons moving to the emitter region 120 are collected by the finger electrodes 141 and are transferred to the front bus bars 143. The holes moving to the substrate 110 are transferred to the connection electrodes 151 and are collected by the back bus bars 155. When the front bus bars 143 are connected to the back bus bars 155 using conductive wires, current flows therein to thereby enable use of the current for electric power.

As shown in FIG. 2, the solar cell according to the embodiment of the invention further includes the adhesion enhanced layer 190 between the back electrode layer 153 and the back passivation layer 170. The adhesion enhanced layer 190 contains at least one of intrinsic amorphous silicon and intrinsic microcrystalline silicon.

The adhesion enhanced layer 190 physically and chemically fixes the back electrode layer 153 to the second surface of the substrate 110. Thus, when the adhesion enhanced layer 190 is formed, a chemical combination is generated at an interface between the adhesion enhanced layer 190 and the back electrode layer 153. Hence, as shown in FIGS. 1 and 2, the adhesion enhanced layer 190 may prevent a crack from being generated between the back electrode layer 153 and the connection electrodes 151 due to an adhesion pressure of interconnectors in a tabbing process for electrically connecting the plurality of solar cells to one another using the interconnectors.

The adhesion enhanced layer 190 and the back passivation layer 170 abutting on the adhesion enhanced layer 190 are described in detail below.

Figure 3:
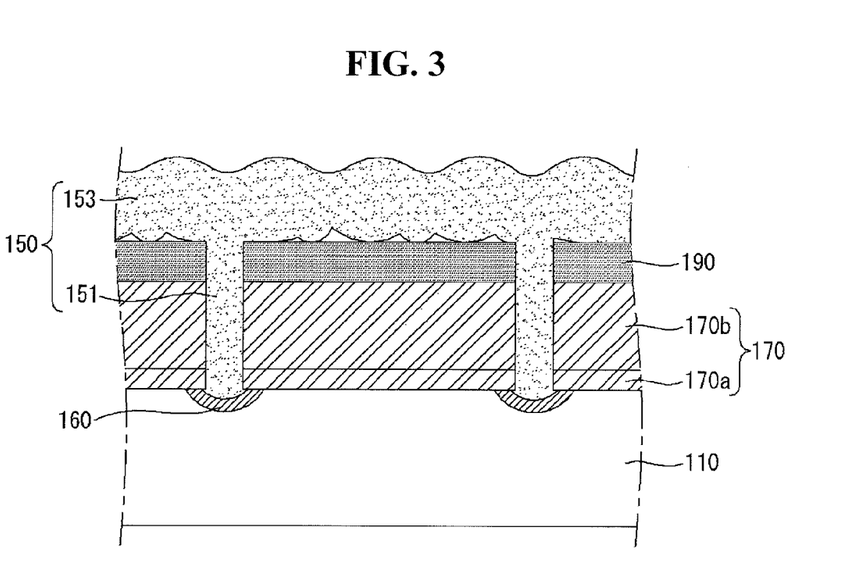
FIG. 3 is an enlarged view of a portion "K" of FIG. 2.

FIG. 3 is an enlarged view of a portion "K" of FIG. 2 so as to describe in detail the adhesion enhanced layer and the back passivation layer.

As shown in FIG. 3, the solar cell according to the embodiment of the invention further includes the adhesion enhanced layer 190 on the back passivation layer 170 positioned on the second surface of the substrate 110.

In the embodiment of the invention, the back passivation layer 170 may contain at least one of aluminum oxide (AlOx), silicon oxide (SiOx), silicon nitride (SiNx), and silicon oxynitride (SiOxNy) and may include a plurality of layers.

For example, as shown in FIG. 3, the back passivation layer 170 may include a first passivation layer 170a abutting on the substrate 110 and a second passivation layer 170b positioned on the first passivation layer 170a.

In this instance, for example, when the substrate 110 has positive (+) charge characteristics of the p-type, the first passivation layer 170a directly contacting the substrate 110 may contain aluminum oxide (AlOx) having negative (−) charge characteristics, and the second passivation layer 170b may contain silicon oxide (SiOx) having positive (+) charge characteristics.

On the contrary, if the substrate 110 has negative (−) charge characteristics of the n-type unlike the embodiment of the invention, the back passivation layer 170 may has a single-layered structure. In this instance, the back passivation layer 170 may contain at least one of silicon oxide (SiOx), silicon nitride (SiNx), and silicon oxynitride (SiOxNy), each of which has positive (+) charge characteristics.

As shown in FIG. 3, when the back passivation layer 170 includes the first passivation layer 170a and the second passivation layer 170b, a thickness of the first passivation layer 170a may be about 5 nm to 15 nm, and a thickness of the second passivation layer 170b may be about 150 nm to 250 nm.

Further, a thickness of the adhesion enhanced layer 190 according to the embodiment of the invention may be about 10 nm to 100 nm.

A reason why the thickness of the adhesion enhanced layer 190 is equal to or greater than about 10 nm is to form the back electrode layer 153 on the adhesion enhanced layer 190 and to secure a minimum thickness capable of forming the chemical combination when the thermal process is performed to form the chemical combination between the back electrode layer 153 and the adhesion enhanced layer 190. Further, in this instance, a reflectance of the adhesion enhanced layer 190 may further increase.

Further, a reason why the thickness of the adhesion enhanced layer 190 is equal to or less than about 100 nm is to prevent an excessive increase in the thickness of the adhesion enhanced layer 190 while increasing the reflectance of the adhesion enhanced layer 190. Hence, the manufacturing cost and time of the solar cell may be reduced.

More specifically, the adhesion enhanced layer 190 may be formed by depositing at least one of intrinsic amorphous silicon and intrinsic microcrystalline silicon on the back passivation layer 170 in a vacuum chamber using a chemical vapor deposition (CVD) method such as a plasma enhanced CVD (PECVD) method. In this instance, as the thickness of the adhesion enhanced layer 190 increases, a deposition time in the vacuum chamber may increase. Hence, the manufacturing cost may increase. Therefore, it is preferable, but not required, that the thickness of the adhesion enhanced layer 190 is equal to or less than about 100 nm in consideration of this.

In the embodiment of the invention, a refractive index of the adhesion enhanced layer 190 may be greater than a refractive index of the back passivation layer 170. For example, the refractive index of the adhesion enhanced layer 190 may be about 3.7 to 4.2, and the refractive index of the back passivation layer 170 may be about 1.7 to 2.3.

Light of a long wavelength band (for example, about 900 nm to 1300 nm), which is not absorbed in the substrate 110 among light of various wavelength bands incident on the first surface of the substrate 110, is again reflected into the substrate 110 by a difference between the refractive indexes of the adhesion enhanced layer 190 and the back passivation layer 170. Hence, the power generation efficiency of the solar cell may be improved. The light reflection through the adhesion enhanced layer 190 is related to the thickness of the adhesion enhanced layer 190. This is described in detail with reference to FIG. 6.

The chemical combination of the adhesion enhanced layer 190 is described in detail below.

Figure 4:
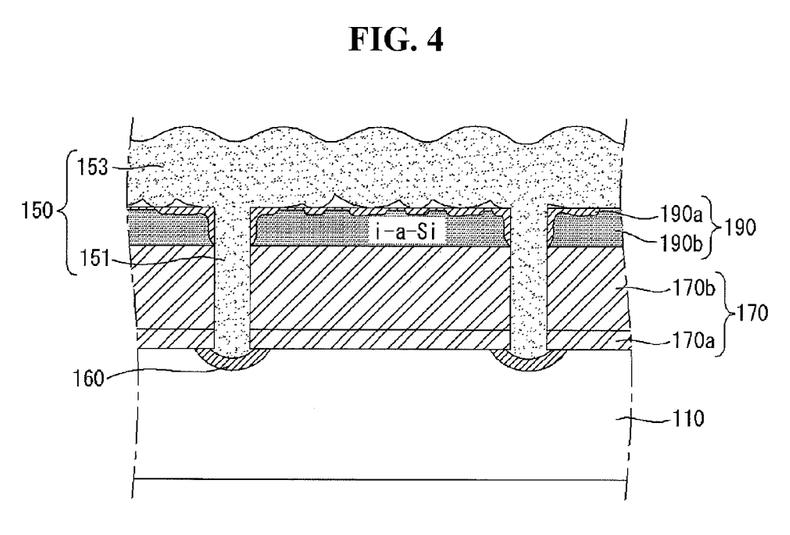
FIGS. 4 and 5 illustrate a chemical combination generated at an interface between an adhesion enhanced layer and a back electrode layer.
Figure 5:
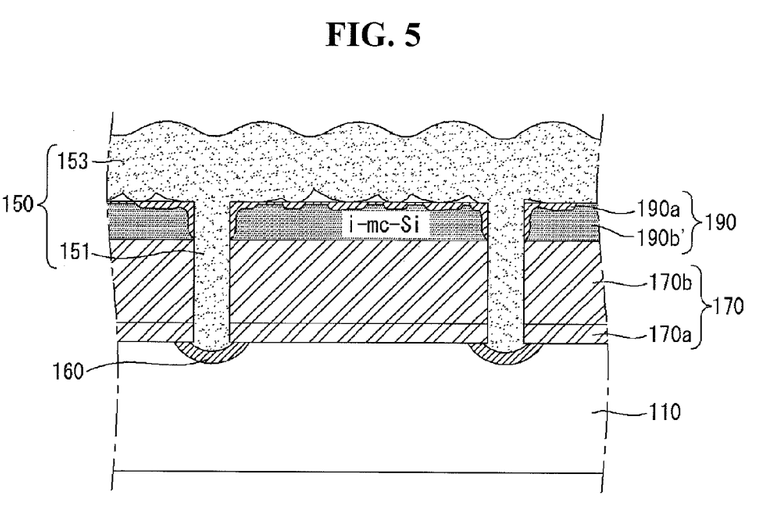

FIGS. 4 and 5 illustrate the chemical combination generated at an interface between the adhesion enhanced layer and the back electrode layer.

As shown in FIG. 4, the adhesion enhanced layer 190 according to the embodiment of the invention may include, for example, an intrinsic amorphous silicon (a-Si) layer 190b. Further, the adhesion enhanced layer 190 may include a metal-silicon alloy layer 190a at an interface between the adhesion enhanced layer 190 and the back electrode layer 153.

When the back electrode layer 153 contains, for example, aluminum (Al), the metal-silicon alloy layer 190a formed at the interface between the adhesion enhanced layer 190 and the back electrode layer 153 may be an aluminum-silicon alloy layer.

The metal-silicon alloy layer 190a is formed by a chemical combination between a silicon material contained in the adhesion enhanced layer 190 and a metal material contained in the back electrode layer 153. As described above, the chemical combination between the adhesion enhanced layer 190 and the back electrode layer 153 may strongly and stably attach the back electrode layer 153 to the second surface of the substrate 110.

Accordingly, the solar cell according to the embodiment of the invention including the adhesion enhanced layer 190 on the second surface of the substrate 110 may prevent a phenomenon, in which a crack is generated between the back electrode layer 153 and the connection electrodes 151 while a portion of the back electrode layer 153 is pushed by the adhesion pressure of the interconnectors to thereby cause a short circuit between the back electrode layer 153 and the connection electrodes 151 in the tabbing process for electrically connecting the plurality of solar cells to one another using the interconnectors.

As shown in FIG. 4, the metal-silicon alloy layer 190a may be formed at an interface between the adhesion enhanced layer 190 and the connection electrodes 151 as well as the interface between the adhesion enhanced layer 190 and the back electrode layer 153. Hence, the short circuit between the back electrode layer 153 and the connection electrodes 151 in the subsequent tabbing process may be efficiently prevented.

A method for forming the metal-silicon alloy layer 190a is briefly described below.

First, the back passivation layer 170 is formed on the second surface of the substrate 110, and then the adhesion enhanced layer 190 including the intrinsic amorphous silicon layer 190b is formed on the back passivation layer 170.

In this instance, the adhesion enhanced layer 190 including the intrinsic amorphous silicon layer 190b may be formed in the vacuum chamber using the CVD method such as the PECVD method.

Next, a paste (hereinafter referred to as "second electrode paste") for the second electrode 150 containing, for example, aluminum is applied to the adhesion enhanced layer 190 in a state where the intrinsic amorphous silicon layer 190b of the adhesion enhanced layer 190 is deposited, to form the connection electrodes 151 and the back electrode layer 153.

Next, the thermal process is performed on the second electrode paste to form the second electrode 150, and the back surface field regions 160 are formed between the second surface of the substrate 110 and the connection electrodes 151. In the embodiment of the invention, a maximum temperature of the thermal process may be about 700° C. to 800° C.

In the thermal process for firing the second electrode paste to form the second electrode 150, aluminum contained in the second electrode paste is melted, and silicon contained in the intrinsic amorphous silicon layer 190b is partially melted.

Hence, aluminum contained in the second electrode paste and silicon contained in the intrinsic amorphous silicon layer 190b are chemically combined. Thus, as shown in FIG. 4, the metal-silicon alloy layer 190a may be formed at the interface between the adhesion enhanced layer 190 and the back electrode layer 153.

As shown in FIG. 5, the metal-silicon alloy layer 190a formed at the interface between the adhesion enhanced layer 190 and the back electrode layer 153 may be equally applied to the structure of the adhesion enhanced layer 190 containing intrinsic microcrystalline silicon.

Namely, as shown in FIG. 5, the adhesion enhanced layer 190 may include the metal-silicon alloy layer 190a and an intrinsic microcrystalline silicon 190b'.

In the above-described thermal process for firing the second electrode paste to form the second electrode 150, the intrinsic microcrystalline silicon 190b' may be formed by relatively increasing a time for which the maximum temperature of the thermal process is held.

For example, when the maximum temperature of the thermal process of the second electrode paste is held for several seconds, for example, about 3 to 5 seconds, a phase change is little generated in the intrinsic amorphous silicon layer 190b of the adhesion enhanced layer 190. The chemical combination may be generated only at an interface between the adhesion enhanced layer 190 and the second electrode paste.

On the other hand, when the maximum temperature of the thermal process of the second electrode paste is held for several tens of seconds to several minutes, the phase change may be generated in the intrinsic amorphous silicon layer 190b of the adhesion enhanced layer 190 as well as the interface between the adhesion enhanced layer 190 and the second electrode paste.

More specifically, the intrinsic amorphous silicon layer 190b of the adhesion enhanced layer 190 may be partially crystallized in proportion to the hold time of the maximum temperature of the thermal process and thus may be changed to the intrinsic microcrystalline silicon 190b'. Further, crystallinity of the intrinsic microcrystalline silicon 190b' may depend on the maximum temperature of the thermal process and the hold time of the maximum temperature.

FIGS. 4 and 5 show that the adhesion enhanced layer 190 includes the metal-silicon alloy layer 190a and the intrinsic amorphous silicon layer 190b or the metal-silicon alloy layer 190a and the intrinsic microcrystalline silicon 190b'. Alternatively, the adhesion enhanced layer 190 may include the metal-silicon alloy layer 190a and both the intrinsic amorphous silicon layer 190b and the intrinsic microcrystalline silicon 190b'.

As described above, because the adhesion enhanced layer 190 according to the embodiment of the invention is used to firmly attach and fix the back electrode layer 153 to the second surface of the substrate 110, an amount of a glass frit contained in the back electrode layer 153 may be reduced to be equal to or less than about 1 wt % per unit volume of the second electrode 150.

More specifically, when the back electrode layer 153 is firmly attached to the back passivation layer 170 positioned on the second surface of the substrate 110 without using the adhesion enhanced layer 190, the amount of the glass frit contained in the back electrode layer 153 has to increase.

Because the glass frit of the back electrode layer 153 contains lead (Pb) when the adhesion enhanced layer 190 is not used, the back electrode layer 153 may physically perforate the back passivation layer 170 in the thermal process. However, when the amount of the glass frit increases, an environmental pollution may be caused by lead (Pb) contained in the glass frit.

On the other hand, in the embodiment of the invention, because the adhesion enhanced layer 190 does not contain lead (Pb), the environmental pollution is not caused.

Further, because the adhesion enhanced layer 190 according to the embodiment of the invention does not physically perforate the back passivation layer 170, the back passivation layer 170 is not damaged. Thus, the passivation function of the back passivation layer 170 is not reduced.

Figure 6:
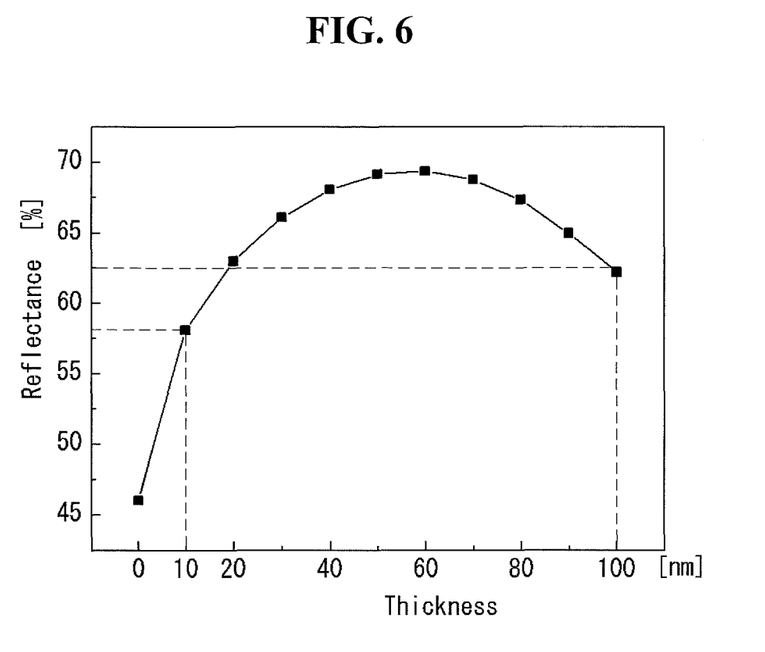
FIG. 6 is a graph indicating a reflectance of an adhesion enhanced layer depending on a thickness of an adhesion enhanced layer.

FIG. 6 is a graph indicating a reflectance of the adhesion enhanced layer depending on the thickness of the adhesion enhanced layer according to the embodiment of the invention.

In FIG. 6, an x-axis indicates the thickness of the adhesion enhanced layer 190, and a y-axis indicates a reflectance of the adhesion enhanced layer 190. In FIG. 6, a reflectance of light having a wavelength of, for example, about 1,100 nm was measured.

As described above, because the refractive index of the adhesion enhanced layer 190 is greater than the refractive index of the back passivation layer 170, light of a long wavelength band (for example, about 900 nm to 1300 nm), which is not absorbed in the substrate 110 among light of various wavelength bands incident on the first surface of the substrate 110, may be again reflected into the substrate 110.

As described above, a reflectance of the light of the long wavelength band may vary depending on the thickness of the adhesion enhanced layer 190.

Accordingly, as described above, the thickness of the adhesion enhanced layer 190 according to the embodiment of the invention may be about 10 nm to 100 nm. The thickness (i.e., about 10 nm to 100 nm) of the adhesion enhanced layer 190 may be an optimum thickness capable of reflecting the light of the long wavelength band.

As shown in FIG. 6, when there was no adhesion enhanced layer 190, i.e., the thickness of the adhesion enhanced layer 190 was zero, a reflectance of light reflected in a direction travelling from the second surface to the first surface of the substrate 110 was equal to or less than about 50%.

On the other hand, when the adhesion enhanced layer 190 according to the embodiment of the invention was formed and the thickness of the adhesion enhanced layer 190 was about 10 nm, the reflectance of the adhesion enhanced layer 190 was about 58%. Further, when the thickness of the adhesion enhanced layer 190 was about 100 nm, the reflectance of the adhesion enhanced layer 190 was about 62.5%. According to FIG. 6, high reflectance (greater than about 65%) occurs when the thickness of the adhesion enhanced layer 190 was about 40 nm to about 80 nm.

When the thickness of the adhesion enhanced layer 190 continuously increase, the reflectance of the adhesion enhanced layer 190 has the form of a square wave such as a sine wave and a cosine wave.

Accordingly, it is preferable, bur not required, that the thickness of the adhesion enhanced layer 190 according to the embodiment of the invention is about 10 nm to 100 nm.

Figure 7:
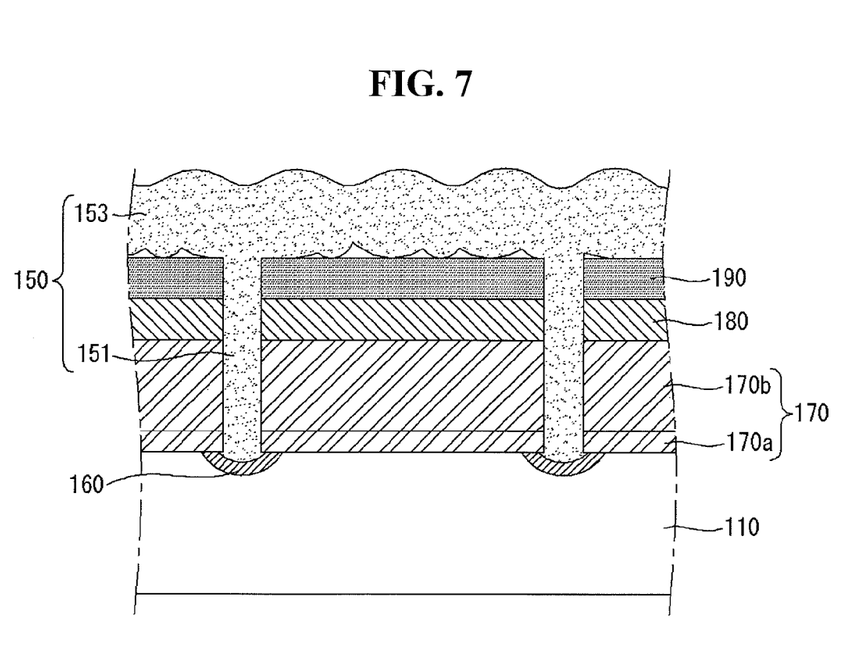
FIG. 7 shows that a solar cell according to an example embodiment of the invention further includes a diffusion barrier layer between an adhesion enhanced layer and a back passivation layer.

So far, the embodiment of the invention described that the adhesion enhanced layer 190 contacts and is directly formed on the back passivation layer 170. Alternatively, the solar cell according to the embodiment of the invention may further include a diffusion barrier layer between the back passivation layer 170 and the adhesion enhanced layer 190.

FIG. 7 shows that the solar cell according to the embodiment of the invention further includes a diffusion barrier layer between the back passivation layer and the adhesion enhanced layer.

As shown in FIG. 7, the solar cell according to the embodiment of the invention may further include a diffusion barrier layer 180 between the back passivation layer 170 and the adhesion enhanced layer 190.

The diffusion barrier layer 180 positioned between the back passivation layer 170 and the adhesion enhanced layer 190 prevents aluminum (Al) contained in the paste for the second electrode 150 from being diffused into the back passivation layer 170 in the thermal process for forming the second electrode 150.

The diffusion barrier layer 180 may contain silicon nitride ($SiN_x$). Silicon nitride ($SiN_x$) contained in the diffusion barrier layer 180 is combined with aluminum (Al) contained in the back electrode layer 153 in the thermal process for forming the second electrode 150, thereby preventing aluminum (Al) from being diffused into the back passivation layer 170. Hence, a reduction in the passivation function of the back passivation layer 170 resulting from the diffusion of aluminum (Al) of the back electrode layer 153 into the back passivation layer 170 may be prevented.

A refractive index of the diffusion barrier layer 180 may have a value between the refractive index of the adhesion enhanced layer 190 and the refractive index of the back passivation layer 170. For example, the refractive index of the diffusion barrier layer 180 may be about 2.1 to 2.3 between the refractive index of the adhesion enhanced layer 190 and the refractive index of the back passivation layer 170. A thickness of the diffusion barrier layer 180 may be about 30 nm to 70 nm.

As the respective refractive indexes of the back passivation layer 170, the diffusion barrier layer 180, and the adhesion enhanced layer 190 are numbers that increases in going from the back passivation layer 170 to the adhesion enhanced layer 190, the reflectance of the adhesion enhanced layer 190 may be further improved.

Further, the diffusion barrier layer 180 may be formed by changing only a process gas in the same chamber as the adhesion enhanced layer 190. Thus, the manufacturing cost of the solar cell including the diffusion barrier layer 180 may be reduced.

More specifically, silane ($SiH_4$) gas and hydrogen ($H_2$) gas as the process gas are used to deposit the adhesion enhanced layer 190 including at least one of the intrinsic amorphous silicon layer 190b and the intrinsic microcrystalline silicon 190b'. Further, silane ($SiH_4$) gas and ammonia ($NH_3$) gas as the process gas are used to deposit the diffusion barrier layer 180 containing silicon nitride ($SiN_x$).

Accordingly, silane ($SiH_4$) gas and ammonia ($NH_3$) gas as the process gas are injected into the back passivation layer 170 to deposit the diffusion barrier layer 180 on the back passivation layer 170. Next, silane ($SiH_4$) gas and hydrogen ($H_2$) gas, instead of ammonia ($NH_3$) gas, as the process gas are injected into the diffusion barrier layer 180 in the same chamber as the diffusion barrier layer 180 to deposit the adhesion enhanced layer 190 on the diffusion barrier layer 180. Namely, the same chamber is used to deposit the diffusion barrier layer 180 and the adhesion enhanced layer 190.

Accordingly, the manufacturing cost of the solar cell according to the embodiment of the invention including the diffusion barrier layer 180 and the adhesion enhanced layer 190 may be reduced.

As described above, the solar cell according to the embodiment of the invention includes the adhesion enhanced layer 190 on the second surface of the substrate 110, thereby firmly attaching the back electrode layer 153 to the second surface of the substrate 110. Hence, an adhesive strength of the back electrode layer 153 may be improved. The solar cell according to the embodiment of the invention holds a state, where the back electrode layer 153 and the connection electrodes 151 are not physically and electrically separated from each other and are firmly attached to each other, in the tabbing process for connecting the plurality of solar cells to one another using the interconnectors. Further, the solar cell according to the embodiment of the invention efficiently reflects light of the long wavelength band, thereby further improving the efficiency of the solar cell.

The solar cell according to the embodiment of the invention further includes the diffusion barrier layer 180 between the back passivation layer 170 and the adhesion enhanced layer 190, thereby further improving the reflectance of light of the long wavelength band. Further, a reduction in the passivation function of the back passivation layer 170 may be prevented, and the efficiency of the solar cell may be improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
    a substrate containing impurities of a first conductive type;
    an emitter region positioned at a first surface of the substrate, the emitter region containing impurities of a second conductive type opposite the first conductive type;
    a first electrode which is positioned on the first surface of the substrate and is electrically connected to the emitter region;
    a back passivation layer positioned on a second surface opposite the first surface of the substrate, the back passivation layer having a plurality of holes and containing at least one of aluminum oxide (AlOx), silicon oxide (SiOx), silicon nitride (SiNx), and silicon oxynitride SiOxNy);
    an adhesion enhanced layer positioned on the back passivation layer, the adhesion enhanced layer containing at least one of intrinsic amorphous silicon and intrinsic microcrystalline silicon, and having a plurality of holes; and
    a second electrode which is positioned on the adhesion enhanced layer and is electrically connected to the substrate through the plurality of holes of the adhesion enhanced layer and the plurality of holes of the back passivation layer, the second electrode including a plurality of connection electrodes and a back electrode layer, the plurality of connection electrodes being positioned inside the plurality of holes of the adhesion enhanced layer and inside the plurality of holes of the back passivation layer, and the back electrode layer being positioned on the plurality of connection electrodes and the adhesion enhanced layer, wherein the adhesion enhanced layer further includes a metal-silicon alloy layer, and the metal-silicon alloy layer is positioned at an interface between the adhesion enhanced layer and the back electrode layer as well as at an interface between an inside surface of the plurality of holes of the adhesion enhanced layer and the plurality of connection electrodes but the metal-silicon alloy layer is not positioned at an interface between an inside surface of the plurality of holes of the back passivation layer and the plurality of connection electrodes.

2. The solar cell of claim 1, wherein the metal-silicon alloy layer is an aluminum-silicon alloy layer.

3. The solar cell of claim 1, wherein a thickness of the adhesion enhanced layer is about 10 nm to 100 nm.

4. The solar cell of claim 1, wherein a refractive index of the adhesion enhanced layer is greater than a refractive index of the back passivation layer.

5. The solar cell of claim 1, wherein a refractive index of the adhesion enhanced layer is about 3.7 to 4.2.

6. The solar cell of claim 1, further comprising a diffusion barrier layer positioned between the back passivation layer and the adhesion enhanced layer.

7. The solar cell of claim 6, wherein the diffusion barrier layer contains silicon nitride ($SiN_x$).

8. The solar cell of claim 6, wherein a refractive index of the diffusion barrier layer is about 2.1 to 2.3.

9. The solar cell of claim 6, wherein a thickness of the diffusion barrier layer is about 30 nm to 70 nm.

10. The solar cell of claim 1, wherein the back passivation layer includes a plurality of layers.

11. The solar cell of claim 10, wherein the back passivation layer includes a first passivation layer abutting on the substrate and a second passivation layer positioned on the first passivation layer.

12. The solar cell of claim 11, wherein the first passivation layer contains aluminum oxide (AlOx), and the second passivation layer contains silicon oxide (SiOx).

13. The solar cell of claim 11, wherein a thickness of the first passivation layer is about 5 nm to 15 nm, and a thickness of the second passivation layer is about 150 nm to 250 nm.

* * * * *